United States Patent
Sprietsma et al.

(10) Patent No.: US 6,180,215 B1
(45) Date of Patent: Jan. 30, 2001

(54) MULTILAYER PRINTED CIRCUIT BOARD AND MANUFACTURING METHOD THEREOF

(75) Inventors: John T. Sprietsma, Hillsboro; James V. Noval, Beaverton, both of OR (US)

(73) Assignee: Intel Corporation, Santa Clara, CA (US)

(*) Notice: Under 35 U.S.C. 154(b), the term of this patent shall be extended for 0 days.

(21) Appl. No.: 09/353,310

(22) Filed: Jul. 14, 1999

(51) Int. Cl.$^7$ .................................. B32B 3/00; H05K 1/11
(52) U.S. Cl. .................... 428/209; 428/901; 174/255; 174/258; 361/792; 361/794; 361/795
(58) Field of Search .................................. 174/255, 258; 361/792, 794, 795; 428/209, 901

(56) References Cited

U.S. PATENT DOCUMENTS

| | | | |
|---|---|---|---|
| 4,812,355 | * 3/1989 | Yokoyama et al. | 428/215 |
| 5,103,293 | * 4/1992 | Bonafino et al. | 257/729 |
| 5,162,977 | * 11/1992 | Paurus et al. | 361/762 |
| 5,206,074 | * 4/1993 | Davis et al. | 428/209 |
| 5,569,545 | * 10/1996 | Yokono et al. | 428/626 |
| 5,785,789 | * 7/1998 | Gagnon et al. | 156/246 |
| 5,965,245 | * 10/1999 | Okano et al. | 428/297.4 |

\* cited by examiner

*Primary Examiner*—Cathy Lam
(74) *Attorney, Agent, or Firm*—Antonelli, Terry, Stout & Kraus, LLP

(57) ABSTRACT

Disclosed is a multilayer (e.g., 4-layer) printed circuit board and method of manufacture thereof. The multilayer printed circuit board has at least one inner substrate (inner core) that includes a phenolic resin (e.g., a phenolic resin-laminated paper). Outer insulating layers of the multilayer printed circuit board can have a low dielectric constant (e.g., 3.8–4.4) and a high $T_g$ (e.g., 180°–200° C.). The multilayer printed circuit board can be provided by steps including forming electrical circuit patterns from a copper foil on the inner substrate, to form a printed circuit board, forming a stack of at least one printed circuit board and outer copper foil layers, with insulating layers of, e.g., a semi-cured resin (e.g., prepreg layers) interposed between adjacent conductive metal layers, and then laminating the stack.

33 Claims, 4 Drawing Sheets

MULTILAYER PRINTED CIRCUIT BOARD AND MANUFACTURING METHOD THEREOF

FIELD

The present invention is directed to a printed circuit board having a multilayer structure, and methods of manufacture thereof.

BACKGROUND

Multilayer printed circuit boards, having an inner core member with an electrical circuit pattern thereon made from copper foil, and additionally having layers of electrical circuit patterns made from copper foil and interleaved with sheets of prepreg, have recently been used in various electronics industries for providing electrical circuits, including electrical circuits to be electrically connected to integrated circuit chips, and for supporting these chips. These multilayer printed circuit boards are formed using at least one member of fiber glass-reinforced epoxy resin (FR4 material) as an inner core or inner substrate, having electrical circuit patterns formed from copper foils along each side of the inner core, and the core and electrical circuit patterns being sandwiched by alternating layers of prepreg material and electrical circuit patterns, e.g., made from copper foil. Outer layers of the multilayer printed circuit boards include electrical circuit patterns made from copper foil. The layers of prepreg material are layers of fiber glass or other fabric which have been saturated with polymer resin and the resin partially cured (the resin being in the B-stage). In the produced multilayer printed circuit board, the polymer resin has been cured to the C-stage to form a laminate.

These multilayer printed circuit boards can be fabricated by the following processing steps. Initially, at least one inner core, of the FR4 material, is provided and copper foil is adhered to opposing sides thereof. Thereafter, the copper foil is etched to form desired electrical circuit patterns. Alternating layers of prepreg material and electrical circuit patterns (made from copper foil layers) are provided along both of the opposed sides of the inner core or cores having the electrical circuit patterns thereon, to form a stack, with at least one prepreg layer provided between adjacent layers of electrical circuit patterns. Copper foil forms the outer layers of these multilayer printed circuit boards, and these outer layer copper foils are etched to form desired electrical circuit patterns and/or connections for electrical components such as integrated circuit chips. The stack is subjected to heat and pressure to cure resin material of the prepregs so as to form a laminate of the stack.

The number of layers of prepreg material, and the total number of layers of copper foil (including layers of copper foil on the inner core, with each copper foil layer having been etched to form a desired electrical circuit pattern), can be as desired, but generally four or more layers of copper foil are utilized. Electrical connection to the inner layers of electrical circuit patterns is achieved by drilling via-holes in the formed laminate to the inner layers and providing conductive material in the via-holes, so as to provide electrical connections (1) between electrical circuit patterns of different layers of the laminate and (2) between electrical circuit patterns of the inner layers of the laminate and outside circuits, including components such as integrated circuit devices provided on the multilayer printed circuit board.

The inner core of FR4 material maintains the thickness of the circuit board, to be, for example, 0.62 mils or 0.90 mils.

A problem with conventional multilayer printed circuit boards is that the FR4 material of the inner core is expensive.

SUMMARY

The present invention, in various embodiments, includes a laminate. The laminate has an inner substrate, of a material including a phenolic resin, the inner substrate having first and second opposed surfaces. This laminate has at least one first insulating layer positioned along the first opposed surface of the inner substrate, and at least one second insulating layer positioned along the second opposed surface of the inner substrate. A first conductive material layer is positioned on a surface of the at least one first insulating layer and forms an outer layer of the laminate.

BRIEF DESCRIPTION OF THE INVENTION

DETAILED DESCRIPTION

Figure 1:
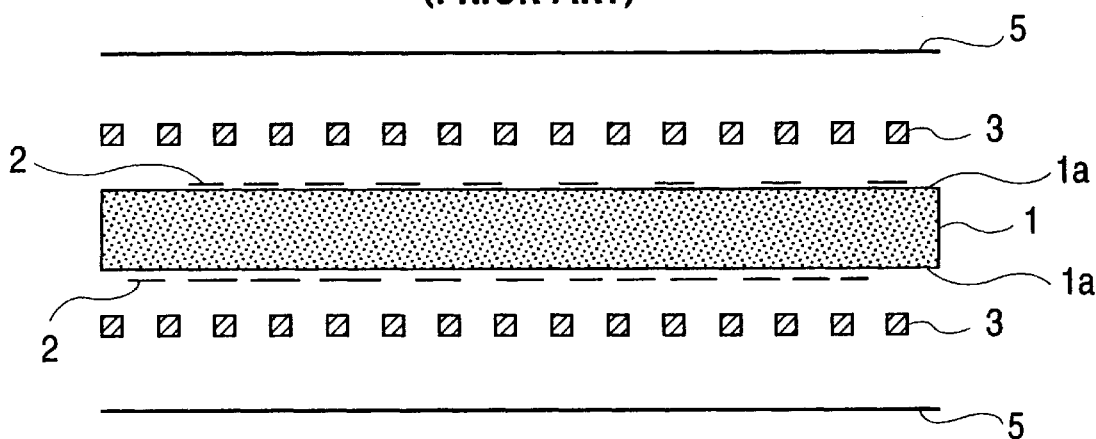
FIG. 1 is a schematic sectional view of a conventional 4-layer stack-up, for a multilayer printed circuit board.

While the present invention will be described in connection with specific examples and illustrative embodiments, it will be understood that it is not intended to limit the invention to these described examples and illustrative embodiments. To the contrary, it is intended to cover all alterations, modifications and equivalents as may be included within the spirit and scope of the invention as defined by the appended claims.

Examples and illustrative embodiments of the present invention, in the following, are described in connection with the various drawing figures. components, in the various drawing figures, having corresponding functions are referred to using common reference numerals.

FIG. 1 schematically shows a conventional 4-layer stack-up for a multilayer (4-layer) printed circuit board. In this conventional structure shown in FIG. 1, an inner core 1 of FR4 material is shown, sandwiched by insulating layers 3,3 of a prepreg material and with copper foils 5,5 on the outside (relative to inner core 1) of insulating layers 3,3. FIG. 1 shows inner electrical circuit patterns 2,2 on opposed surfaces 1a, 1a of inner core 1.

Figure 2:
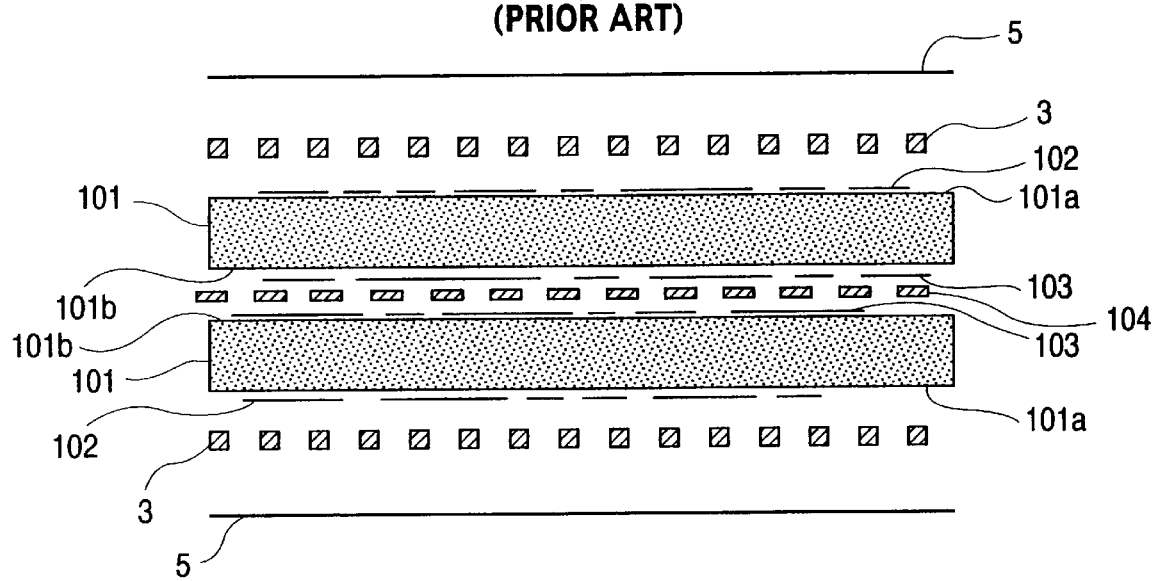
FIG. 2 is a schematic sectional view of a conventional 6-layer stack-up, for a multilayer printed circuit board.

FIG. 2 shows a conventional 6-layer stack-up for a multilayer (6-layer) printed circuit board. This 6-layer stackup utilizes two inner cores 101,101 of FR4 material, the two inner cores 101,101 being sandwiched by insulating layers 3,3 and the 6-layer stack-up having outer copper foils 5,5. Outer copper foils 5,5 are for forming outer electrical circuit patterns and/or pads for component connections.

In FIG. 2, inner electrical circuit patterns 102,102 formed from copper foil are provided on surfaces 101a,101a of inner cores 101,101 between each of inner cores 101 and its respective adjacent insulating layer 3. In addition, two additional layers of electrical circuit patterns 103,103 (formed from copper foil on surfaces 101b,101b of both inner cores 101,101 facing each other) are provided respectively on surfaces 101b,101b of inner cores 101,101 facing each other, with at least one additional layer 104 of prepreg material provided between the two inner cores 101,101.

With electrical circuit patterns 102,102 provided between each of inner cores 101,101 and its adjacent insulating layer 3,3, and with further electrical circuit patterns 103,103 provided on facing surfaces 101b, 101b of inner cores 101,101 (with at least one additional insulating layer 104 of prepreg material between inner cores 101,101), together with copper foils 5,5, six layers of electrical circuit patterns can be provided (a 6-layer printed circuit board).

Figure 3:
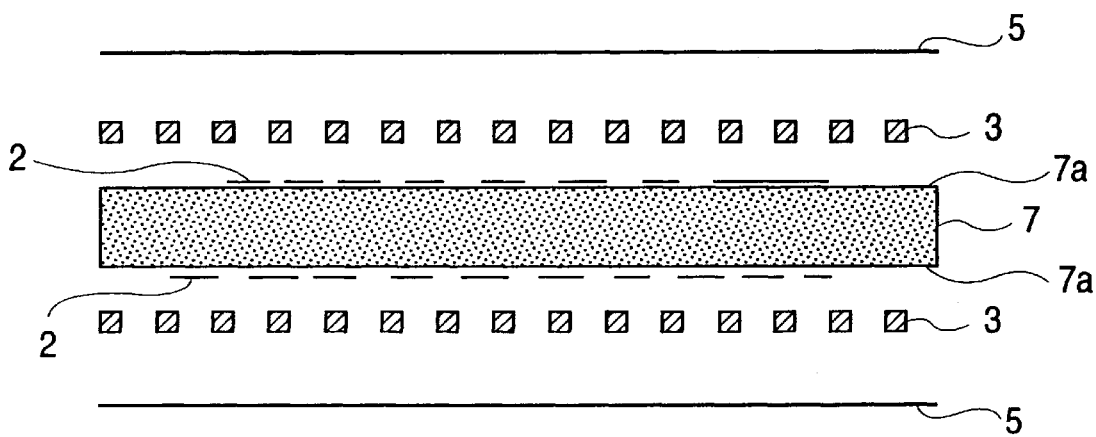
FIG. 3 is a schematic sectional view of a 4-layer stack-up for a multilayer printed circuit board according to an example and illustrative embodiment of the present invention.

An example and illustrative embodiment of the present invention is shown in FIG. 3. In FIG. 3, inner substrate 7 containing a phenolic resin is used, rather than the inner core 1 of FR4 material as in conventional structure shown in FIG. 1. Inner substrate 7 containing a phenolic resin, which, illustratively, can be a phenolic resin-laminated paper, is less expensive than inner core 1 of FR4 material, providing excellent cost savings according to this aspect of the present invention. Furthermore, through use of the phenolic material, high performance aspects obtained through use of the FR4 material are still achieved, while reducing costs. Moreover, the paper of the aforementioned phenolic resin-laminated paper can be a fire-retardant paper, providing additional advantages.

FIG. 3 also shows inner electrical circuit patterns 2,2. Inner electrical circuit patterns 2,2, e.g., made from copper foil layers on opposed surfaces 7a,7a of inner substrate 7, are provided respectively between inner substrate 7 and adjacent insulating layers 3,3 of prepreg material. This can be used to provide a 4-layer printed circuit board (that is, four layers of electrical circuit patterns; inner electrical circuit patterns 2,2 and electrical circuit patterns and/or connection pads formed from copper foils 5,5).

Using an inner substrate of a phenolic resin-containing material for the inner substrate of the 4-layer printed circuit board, various advantages are achieved. For example, in 4-layer printed circuit boards the dielectric thickness between the outer layers and layers interior thereto is decreasing, and a purpose of the inner substrate is to maintain the thickness of the 4-layer printed circuit board at 0.062 mils (that is, thickness of the inner substrate has been increased). Notwithstanding any increase in thickness of the inner substrate, by changing to a phenolic resin-containing material for the inner substrate a cost benefit is achieved.

Figure 4:
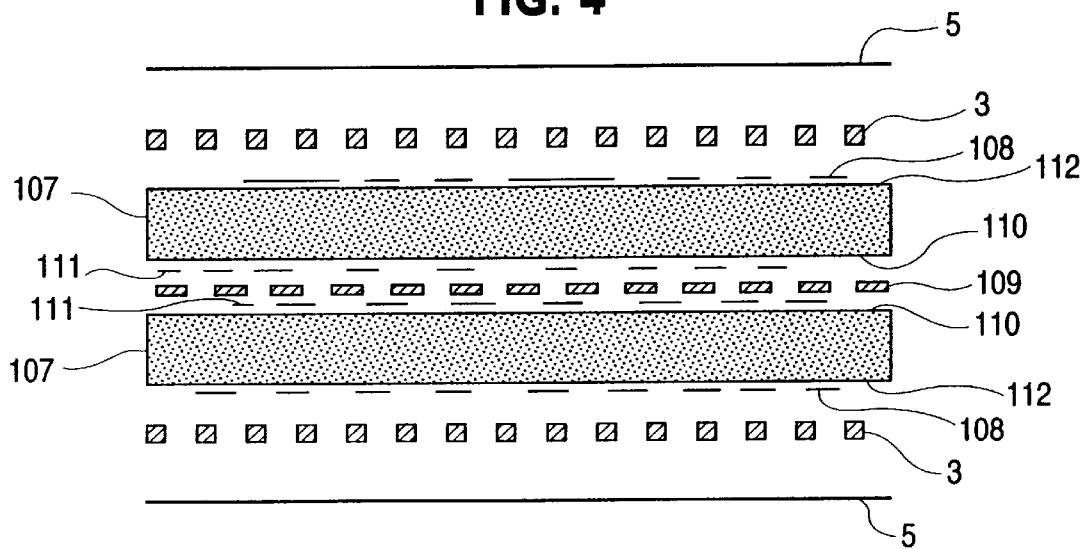
FIG. 4 is a schematic sectional view of a 6-layer stack-up for a multilayer printed circuit board according to another example and illustrative embodiment of the present invention.

FIG. 4 is a schematic sectional view of a 6-layer stack-up for a multilayer circuit board, which is another example and illustrative embodiment of the present invention. In the structure of FIG. 4, two inner substrates 107,107, each containing a phenolic resin material, are utilized, rather than utilizing inner cores 101,101 of FR4 material as seen in FIG. 2. These inner substrates 107,107, each containing phenolic resin, in the structure of FIG. 4, can be of phenolic resin-laminated paper, the paper thereof being a fire-retardant paper (e.g., paper of fire-retardant fibers).

In FIG. 4, additional electrical circuit patterns 108,108 are provided respectively between each of inner substrates 107, 107 and its adjacent insulating layers 3,3 of prepreg material, on surfaces 112,112 of inner substrates 107,107. In addition, by providing at least one additional insulating layer 109 between the two inner substrates 107,107, and by providing additional electrical circuit patterns 111,111 on facing surfaces 110,110 of inner substrates 107,107, a 6-layer stack up for a printed circuit board, having six layers of electrical circuitry, can be provided.

Figure 5:
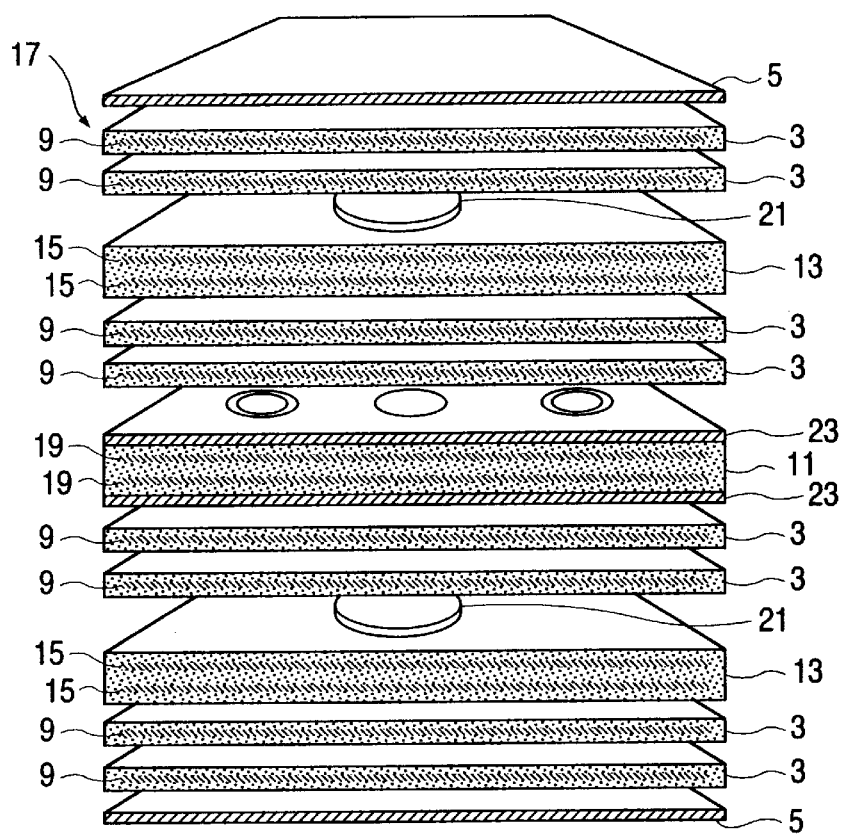
FIG. 5 is a perspective view showing a pre-lamination lay-out of layers for a laminate according to an example and illustrative embodiment of the present invention.
Figure 6:
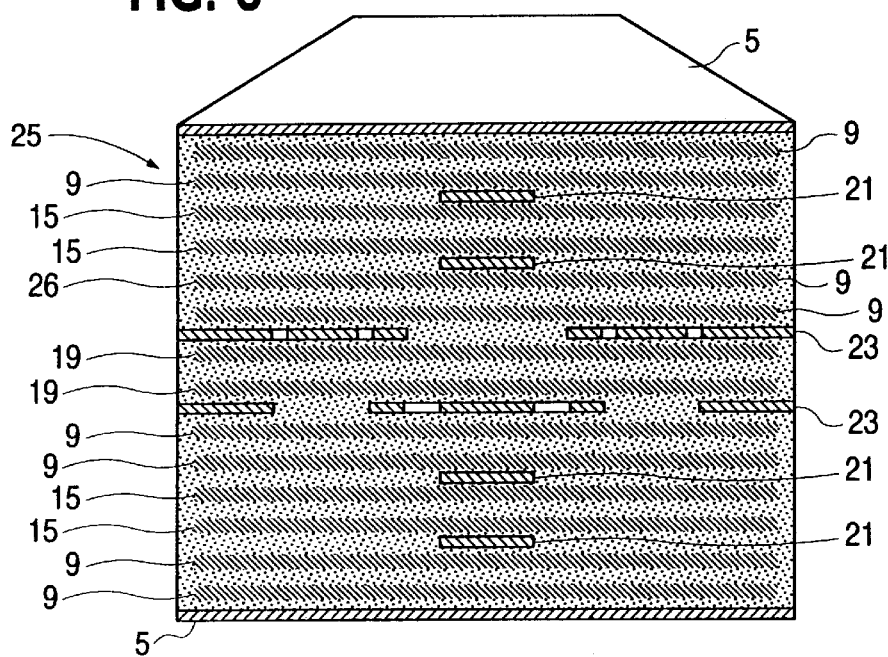
FIG. 6 is a perspective view showing a laminate according to an example and illustrative embodiment of the present invention, after lamination.

FIG. 5 shows a pre-lamination layout of the multiple layers for an 8-layer printed circuit board, according to an example and illustrative embodiment of the present invention having eight layers of electrical circuit patterns (an 8-layer laminate). Shown in FIG. 5 is the pre-lamination structure 17, including power/ground substrate 11 and signal layer substrates 13,13. Power/ground substrate 11 has power and ground wiring layers (electrical circuit patterns) 23,23 on opposite surfaces of substrate 11; and signal layer substrates 13,13 have signal wiring layers (electrical circuit patterns) 21,21 on surfaces thereof (only signal wiring layers 21,21 on upper surfaces of signal layer substrates 13, 13 is shown in FIG. 5; FIG. 6 shows signal wiring layers 21,21 which is on both upper and lower surfaces of each of signal layer substrates 13,13). Interleaved between the power/ground substrate 11 having wiring layers 23,23 thereon and each of the signal layer substrates 13,13 having signal wiring layers 21,21 thereon, are insulating layers 3 of prepreg material. Also shown in FIG. 5 are outer copper foil layers 5,5.

In the structure shown in FIG. 5, two insulating layers 3,3 of prepreg material are provided between the power/ground substrate 11 having power/ground wiring layers 23,23 thereon and each of the signal layer substrates 13 having signal wiring layers 21,21 thereon, and between each of signal layer substrates 13 having signal wiring layers 21,21 thereon and outer copper foils 5,5. However, the present invention is not limited to such number of insulating layers between the layers of wiring. That is, one, or more than two, insulating layers can be provided between adjacent layers of wiring.

Also shown in FIG. 5 are reinforcing material 9 (woven or non-woven fibrous material, such as fiber glass) for each of the insulating layers 3, reinforcing material 15 of each of the signal layer substrates 13, and reinforcing material 19 of the power/ground substrate 11.

Power/ground substrate 11 and signal layer substrates 13,13, which are each inner substrates of multilayer structure 17 in FIG. 5, include phenolic resin. Desirably, power/ground substrate 11 and signal layer substrates 13,13 are of phenolic resin-laminated paper, reinforcing materials represented by reference characters 19 and 15, in FIG. 5, being the paper material.

As seen in FIG. 6, each wiring layer (ground/power wiring layers 23,23, signal wiring layers 21,21,21,21) is provided on a surface of an inner substrate of a material including a phenolic resin, with layers of wiring (electrical circuit patterns) sandwiching each inner substrate. However, aspects of the present invention are not limited to structure wherein each wiring layer is provided on a surface of an inner substrate of a material including a phenolic resin, sandwiching the inner substrate. That is, according to aspects of the present invention, as long as the laminate includes at least one inner substrate of a material including phenolic resin, the laminate can also include a layer of wiring on only one surface of the inner substrate, and/or can include inner substrates (sandwiched by layers of wiring or having a layer of wiring thereon) of materials other than the phenolic resin-containing material (such as a resin-impregnated fiberglass material). Of course, to provide greatest cost benefits for the present invention, each of the inner substrates should be made of the phenolic resin-containing material, sandwiched by electrical circuit patterns.

According to various examples and illustrative embodiments of the present invention, copper foils 5,5, as well as copper foils for forming inner electrical circuit patterns or wiring layers, can have various weights/thicknesses. Illustratively, and not to be limiting, copper foils of ½ ounce weight (having a nominal thickness of 0.75 mils), 1 ounce (having a nominal thickness of 1.4 mils), and 2 ounce (having a nominal thickness of 2.8 mils) can be used. While copper foils of less than ½ ounce can be used in the various examples and illustrative embodiments of the present invention, these foils usually have an aluminum plated carrier layer so the foils do not wrinkle or crease during the lamination process.

According to a further aspect of the present invention, additional advantages are achieved by utilizing a material having a relatively low dielectric constant and high glass transition temperature ($T_g$) as a substitute for the prepreg material of insulating layers 3. For example, additional benefits are achieved utilizing a material for insulating layers 3 having a dielectric constant in the range of 3.8–4.4, and a glass transition temperature in the range of 180–200° C. Thus, according to aspects of the present invention, both reduced costs, and improved performance, are achieved.

FIG. 6 shows multilayer laminate structure 25 achieved after lamination of the structure 17 shown in FIG. 5. Due to, e.g., heat and pressure applied during the lamination process, multilayer laminate structure 25 has layers adhered to each other (FIG. 6 does not show separate layers of prepreg, phenolic resin, etc.), with resin materials of the various insulating layers and inner substrates being schematically shown in FIG. 6 as dielectric 26. Note that after multilayer laminate structure 25 in FIG. 6 is formed, further processing will be performed to etch copper foils 5 (to provide electrical circuit patterns therefrom and provide pads for connecting electrical components), to drill via-holes in multilayer laminate structure 25 (for providing electrical connection of power/ground wiring layers 23,23, and signal wiring layers 21,21,21,21 to each other where appropriate and to external circuitry), to provide electrically conducting material in the via-holes, and to connect components (such an integrated circuit chips) to multilayer laminate structure 25, to provide the manufactured multilayer printed circuit board.

Figure 7:
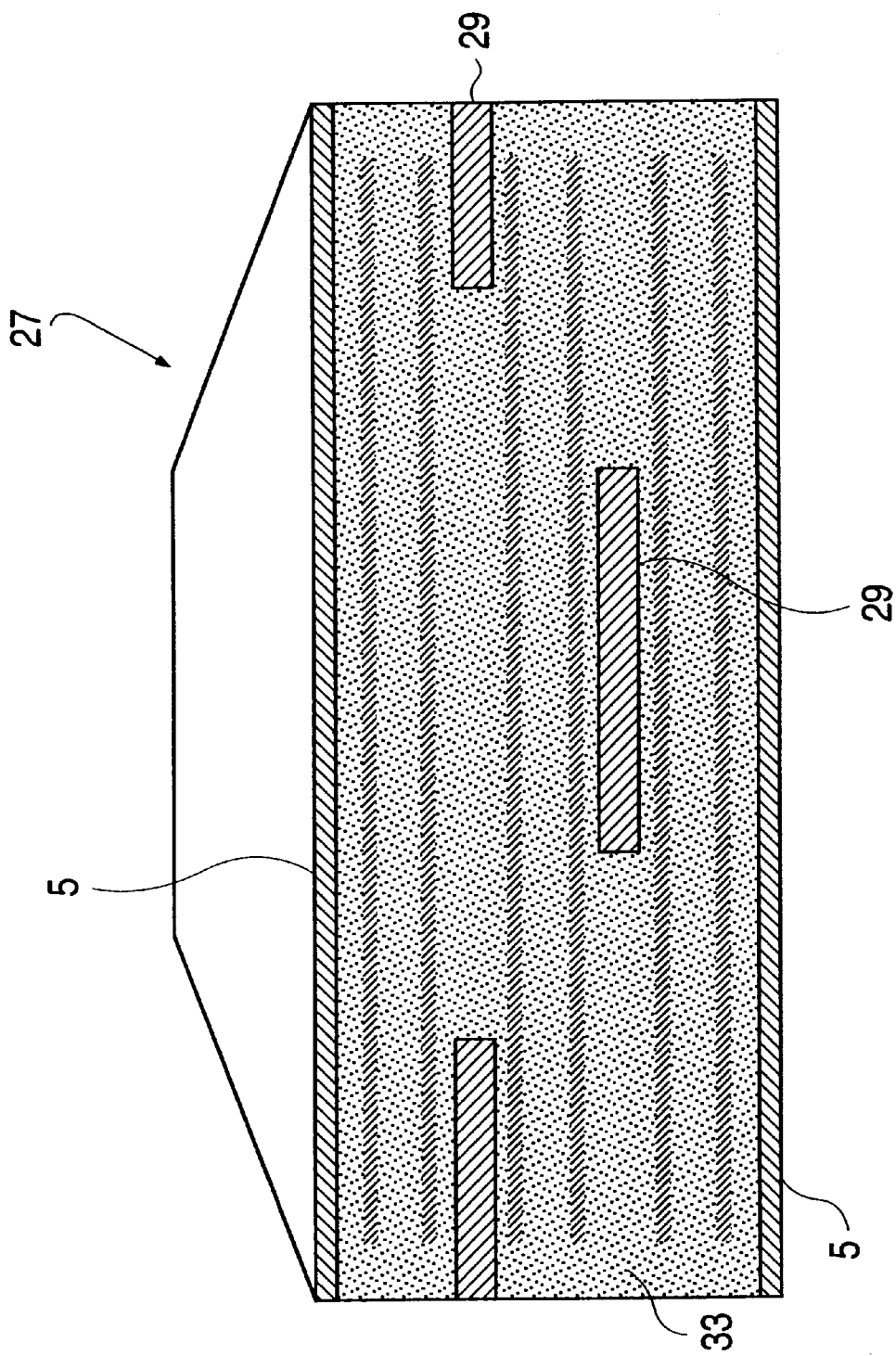
FIG. 7 is a perspective view of a laminate according to another example and illustrative embodiment of the present invention, after lamination.

FIG. 7 shows a laminate according to another example and illustrative embodiment of the present invention, after lamination. In FIG. 7 is shown post-lamination structure 27, having electrical circuit patterns (wiring layers) 29,29 (wiring in two layers), and copper foil layers 5,5. Reference character 33 denotes the dielectric material (resin material) of post-lamination structure 27, formed of material of the inner substrate and prepreg layers fixed to each other by the lamination processing. In this post-lamination structure, the resin material of the prepreg layers is in the C-stage. As with FIG. 6, post-lamination structure 27 shown in FIG. 7 is prior to further manufacturing steps of forming via-holes and forming conductors in these via-holes, etching copper foils 5 to form electrical circuitry therefrom, and fixing electrical components to post-lamination structure 27, in forming the completed multilayer printed circuit board. Post-lamination structure 27 shown in FIG. 7 is a four-layer laminate for a multilayer printed circuit board, having wiring layers 29,29 and copper foil layers 5,5.

The printed circuit board according to the present invention, utilizing a phenolic resin for at least one inner substrate, can be formed utilizing existing manufacturing processes. Thus, for example, sheets or foils of conductive material (e.g., a metal, generally copper), can be adhered respectively to at least one surface of an inner substrate. Thereafter, electrical circuit patterns are formed from, e.g., the conductive metal foil by conventional techniques, such as photolithography and etching, to form a printed circuit board. A plurality of printed circuit boards with electrical circuit patterns thereon can be stacked to form a multilayer construction, with semi-cured, e.g., prepreg layers provided between adjacent boards. Outer layers of a conductive sheet or foil is provided, with semi-cured, e.g., prepreg layers between the boards and outer layers. The stacked structure is subjected to laminating, typical laminating conditions involving heating under pressure (e.g., a pressure between about 200 psi to about 600 psi) at a temperature of between about 150° C. to 205° C. for up to about 4 hours. Electrical circuit patterns of the outer layers may then be interconnected to electrical circuit patterns of the inner layers, and electrical circuit patterns of different inner layers may be connected to each other or to external circuits, by forming via-holes (e.g., by drilling) through the multilayer assembly, and thereafter plating the via-holes with copper to complete the circuit. Components, such as integrated circuit devices, can be provided on the surface of the multilayer circuit board.

The multilayer printed circuit board formed according to aspects of the present invention can be used as conventional multilayer printed circuit boards are used, and can be assembled into electrical devices utilizing existing manufacturing processes.

While the various aspects of the present invention have been described primarily in connection with multilayer printed circuit boards having wiring layers formed from copper foil and using prepreg layers between wiring layers, the present invention is not limited thereto. Generally, various suitable materials for laminating printed circuit boards having an inner substrate can be used, to provide adhesion and electrical insulation. For example, suitable insulating materials can be used, together with suitable adhesives. Moreover, suitable conductive materials can be used for the conductive layers providing the wiring or electrical circuit patterns.

According to the present invention, including aspects and illustrative embodiments specifically disclosed in the foregoing, a cost benefit for the present invention is achieved, while, at the least, maintaining high performance aspects of conventional multilayer printed circuit boards. In addition, a reduced cost is achieved, with structure which can use existing manufacturing processes for both multilayer printed circuit board fabrication and assembly.

While there have been shown and described several examples and illustrative embodiments in accordance with the present invention, it is understood that the same is not limited thereto, but is susceptible of numerous changes and modifications as known to those skilled in the art. Therefore, the invention is not limited to the details shown and described herein, but is intended to cover all such changes and modifications as are encompassed by the scope of the appended claims, including equivalents thereon.

What is claimed is:

1. A laminate, comprising:
   an inner substrate, of a material including a phenolic resin, having first and second opposed surfaces, said material being a phenolic resin-laminated paper;

at least one first insulating layer, positioned along said first opposed surface of said inner substrate;

at least one second insulating layer, positioned along said second opposed surface of said inner substrate; and a first conductive material layer, positioned on a surface of said at least one first insulating layer and forming an outer layer of the laminate.

2. The laminate according to claim 1, wherein the laminate has two outer layers, said first conductive material layer being one of the two outer layers, the laminate further comprising a second conductive material layer, positioned on a surface of said at least one second insulating layer and forming the other outer layer of the laminate.

3. The laminate according to claim 2, wherein said first and second conductive material layers are each made of metal foil.

4. The laminate according to claim 3, wherein said metal foil is a copper foil.

5. The laminate according to claim 1, wherein said inner substrate is a first inner substrate, wherein the laminate further includes a second inner substrate, said second inner substrate having first and second opposed surfaces, with insulating layers extending along the first and second opposed surfaces of the second inner substrate, the second inner substrate being made of material including a phenolic resin, and wherein the second inner substrate is positioned along the first inner substrate.

6. The laminate according to claim 1, wherein said at least one first insulating layer and said at least one second insulating layer are each made of material including a resin.

7. The laminate according to claim 1, wherein each layer of said at least one first insulating layer and said at least one second insulating layer is made of prepreg material.

8. The laminate according to claim 1, wherein each layer of said at least one first insulating layer and said at least one second insulating layer is made of a material including a resin, and has a glass transition temperature of 180°–200° C. and a dielectric constant of 3.8–4.4.

9. The laminate according to claim 1, having conductive material layers respectively between said inner substrate and said at least one first insulating layer, and between said inner substrate and said at least one second insulating layer.

10. The laminate according to claim 1, wherein said at least one first insulating layer includes a plurality of first insulating layers, and said at least one second insulating layer includes a plurality of second insulating layers.

11. The laminate according to claim 10, further comprising a conductive material layer between adjacent first insulating layers of the plurality of first insulating layers, and a conductive material layer between adjacent second insulating layers of the plurality of second insulating layers.

12. The laminate according to claim 1, wherein the at least one first insulating layer and the at least one second insulating layer have a lower dielectric constant and a higher glass transition temperature than the dielectric constant and glass transition temperature of the inner substrate.

13. A multilayer printed circuit board, comprising:

an inner substrate, of a material including a phenolic resin, having first and second opposed surfaces, said material being a phenolic resin-laminated paper;

at least one first insulating layer, positioned along said first opposed surface of said inner substrate;

at least one second insulating layer, positioned along said second opposed surface of said inner substrate; and a first electrical circuit pattern provided on a surface of the at least one first insulating layer and forming an outer layer of the multilayer printed circuit board.

14. A multilayer printed circuit board according to claim 13, wherein the multilayer printed circuit board has two outer layers, the first electrical circuit being one of the two outer layers, the multilayer printed circuit board further comprising a second electrical circuit pattern, provided on a surface of the at least one second insulating layer and forming the other outer layer of the multilayer printed circuit board.

15. A multilayer printed circuit board according to claim 14, further comprising a third electrical circuit pattern between said inner substrate and the at least one first insulating layer, and a fourth electrical circuit pattern between said inner substrate and the at least one second insulating layer.

16. A multilayer printed circuit board according to claim 15, wherein said multilayer printed circuit board is a 4-layer printed circuit board.

17. A multilayer printed circuit board according to claim 15, wherein the at least one first insulating layer is a plurality of first insulating layers, and the at least one second insulating layer is a plurality of second insulating layers; and wherein the printed circuit board further includes fifth electrical circuit patterns, respectively between adjacent layers of the plurality of first insulating layers, and sixth electrical circuit patterns, respectively between adjacent layers of the plurality of second insulating layers.

18. A multilayer printed circuit board according to claim 17, wherein the fifth and sixth electrical circuit patterns are provided on further inner substrates, the further inner substrates being made of a material that includes a phenolic resin.

19. A multilayer printed circuit board according to claim 17, wherein said third and fourth electrical circuits are power and ground circuits, and said fifth and sixth electrical circuits are electrical circuits for signals.

20. A multilayer printed circuit board according to claim 13, wherein said at least one first insulating layer is made of a prepreg material, and said at least one second insulating layer is also made of a prepreg material.

21. A multilayer printed circuit board according to claim 13, wherein said at least one first insulating layer and said at least one second insulating layer are each made of insulating material having a dielectric constant of 3.8–4.4 and a glass transition temperature of 180°–200° C.

22. A laminate, comprising:

an inner substrate, of a material including a phenolic resin, having first and second opposed surfaces;

at least one first insulating layer, positioned along said first opposed surface of said inner substrate;

at least one second insulating layer, positioned along said second opposed surface of said inner substrate; and a first conductive material layer, positioned on a surface of said at least one first insulating layer and forming an outer layer of the laminate, wherein each layer of said at least one first insulating layer and said at least one second insulating layer is made of a material including a resin, and has a glass transition temperature of 180°–200° C. and a dielectric constant of 3.8–4.4.

23. A laminate, comprising:

an inner substrate, of a material including a phenolic resin, having first and second opposed surfaces;

at least one first insulating layer, positioned along said first opposed surface of said inner substrate;

at least one second insulating layer, positioned along said second opposed surface of said inner substrate; and a first conductive material layer, positioned on a surface of said at least one first insulating layer and forming an outer layer of the laminate, wherein the at least one first insulating layer and the at least one second insulating layer have a lower dielectric constant and a higher glass transition temperature than the dielectric constant and glass transition temperature of the inner substrate.

24. A multilayer printed circuit board, comprising:

an inner substrate, of a material including a phenolic resin, having first and second opposed surfaces;

at least one first insulating layer, positioned along said first opposed surface of said inner substrate;

at least one second insulating layer, positioned along said second opposed surface of said inner substrate; and a first electrical circuit pattern provided on a surface of the at least one first insulating layer and forming an outer layer of the multilayer printed circuit board, wherein said at least one first insulating layer and said at least one second insulating layer are each made of insulating material having a dielectric constant of 3.8–4.4 and a glass transition temperature of 180°–200° C.

25. A multilayer printed circuit board, comprising:

an inner substrate, of a material including a phenolic resin, having first and second opposed surfaces;

at least one first insulating layer, positioned along said first opposed surface of said inner substrate;

at least one second insulating layer, positioned along said second opposed surface of said inner substrate; and a first electrical circuit pattern provided on a surface of the at least one first insulating layer and forming an outer layer of the multilayer printed circuit board, wherein the at least one first insulating layer and the at least one second insulating layer have a lower dielectric constant and a higher glass transition temperature than the dielectric constant and glass transition temperature of the inner substrate.

26. A method of manufacturing a laminate, comprising:

providing an inner substrate having first and second opposed surfaces, the inner substrate being made of a material including a phenolic resin, said material being a phenolic resin-laminated paper;

providing at least one first insulating layer;

providing at least one second insulating layer;

stacking the inner substrate, the at least one first insulating layer and the at least one second insulating layer such that the at least one first insulating layer and the at least one second insulating layer sandwich the inner substrate, so as to form a stack;

providing a conducting layer on an outer layer of said stack; and laminating said stack.

27. The method according to claim 26, wherein the first and second insulating layers are made of resin material; and wherein the resin material of the first and second insulating layers, during said laminating step, is cured from B-stage to C-stage.

28. The method according to claim 26, wherein the conducting layer is a metal foil.

29. The method according to claim 26, further including prior to said stacking forming conductive layers along the first and second opposed surfaces of the inner substrate.

30. The method according to claim 29, wherein the at least one first insulating layer includes a plurality of first insulating layers; and in said stacking step further conductive layers are provided between adjacent layers of the plurality of first insulating layers.

31. The method according to claim 30, wherein said further conductive layers are provided on surfaces of further inner substrates; and in the stacking step the further inner substrates, having the further conductive layers on surfaces thereof, are sandwiched between said adjacent layers of the plurality of first insulating layers.

32. A method of manufacturing a laminate, comprising:

providing an inner substrate having first and second opposed surfaces, the inner substrate being made of a material including a phenolic resin;

providing at least one first insulating layer;

providing at least one second insulating layer;

stacking the inner substrate, the at least one first insulating layer and the at least one second insulating layer such that the at least one first insulating layer and the at least one second insulating layer sandwich the inner substrate, so as to form a stack;

providing a conducting layer on an outer layer of said stack; and laminating said stack, wherein each layer of said at least one first insulating layer and said at least one second insulating layer is made of a material including a resin, and has a glass transition temperature of 180°–200° C. and a dielectric constant of 3.8–4.4.

33. A method of manufacturing a laminate, comprising:

providing an inner substrate having first and second opposed surfaces, the inner substrate being made of a material including a phenolic resin;

providing at least one first insulating layer;

providing at least one second insulating layer;

stacking the inner substrate, the at least one first insulating layer and the at least one second insulating layer such that the at least one first insulating layer and the at least one second insulating layer sandwich the inner substrate, so as to form a stack;

providing a conducting layer on an outer layer of said stack; and laminating said stack, wherein the at least one first insulating layer and the at least one second insulating layer have a lower dielectric constant and a higher glass transition temperature than the dielectric constant and glass transition temperature of the inner substrate.

\* \* \* \* \*